(12) United States Patent
Pethica et al.

(10) Patent No.: US 7,632,088 B2
(45) Date of Patent: Dec. 15, 2009

(54) CYCLIC LOADING SYSTEM AND METHODS FOR FORMING NANOSTRUCTURES

(75) Inventors: John B. Pethica, Oxford (GB); Graham Lawrence William Cross, Sidney (CA); Hakan Ozgur Ozer, Konyaalti (TR); Barry S. O'Connell, Dublin (IE)

(73) Assignee: Provost Fellows and Scholars of the College of the Holy and Undivided Trinity of Queen Elizabeth near Dublin, Dublin (IE)

( * ) Notice: Subject to any disclaimer, the term of this patent is extended or adjusted under 35 U.S.C. 154(b) by 80 days.

(21) Appl. No.: 11/875,303

(22) Filed: Oct. 19, 2007

(65) Prior Publication Data
US 2008/0145617 A1 Jun. 19, 2008

Related U.S. Application Data

(60) Provisional application No. 60/862,325, filed on Oct. 20, 2006.

(51) Int. Cl.
*B29C 59/00* (2006.01)
(52) U.S. Cl. ........................ 425/385; 264/293
(58) Field of Classification Search ............... 425/385; 264/293
See application file for complete search history.

(56) References Cited

U.S. PATENT DOCUMENTS

| | | | |
|---|---|---|---|
| 4,701,660 A | 10/1987 | Baumgartner et al. | |
| 5,772,905 A | 6/1998 | Chou | |
| 5,849,435 A * | 12/1998 | Akram et al. | 430/3 |
| 6,362,028 B1 | 3/2002 | Chen et al. | |
| 2005/0006343 A1* | 1/2005 | Choi et al. | 216/59 |
| 2005/0274693 A1* | 12/2005 | Heidari et al. | 216/52 |
| 2008/0145774 A1* | 6/2008 | Kruijt-Stegeman et al. | 430/22 |

OTHER PUBLICATIONS

Asif and Pethica, "Thin films: stresses and mechanical properties VI," *MRS Symp. Proc.* 505:103-108(1998).
Asif, Determination of polymer. mechanical properties from. pyramidal indentation, Doctoral Thesis, Oxford 1997.
Asif, et al. "Nanoindentation creep of single-crystal tungsten and gallium arsenide," Philosophical Magazine A, 76(6)1105-1118 (1997).
Austin, et al. "Fabrication of 5nm linewidth and 14 nm pitch features by nanoimprint lithography" *Appl. Phys. Lett.* 84:5299-5301(2004).
Bartels, et al. "Basic steps of lateral manipulation of single atoms and diatomic clusters with a scanning tunneling microscope tip". *Physical Review Letters* 79(4) :697-700(1997).

(Continued)

*Primary Examiner*—Maria Veronica D Ewald
(74) *Attorney, Agent, or Firm*—Pabst Patent Group LLP (57) ABSTRACT

Systems and methods for forming patterns and structures in target materials are described. The method produces a pattern or structure in a target material by contacting a stamp including one or more features with a target material using a normal load sufficient for keeping the one or more features in contact with the target material, and providing a cyclic shear force in an amount sufficient to extrude the target material and form a negative relief of the one more features in the target material. The systems and methods can be used to produce a variety of articles including, but not limited to, semiconductor integrated electrical circuits, integrated optical, magnetic, mechanical circuits and microdevices.

8 Claims, 8 Drawing Sheets

OTHER PUBLICATIONS

Batrh and Reichling, "Imaging the atomic arrangements on the high-temperature reconstructed $\alpha$-Al$_2$O$_3$ (0001) surface," *Nature* 414:54 57 (2001).

Chou, et al., "Sub-10 nm imprint lithography and applications," *J. Vac. Sci. Tech.* B14:4129-1233 (1996).

Clarke, et al., "Quantitative Scanning Tunneling Microscopy at Atomic Resolution: Influence of Forces and Tip Configuration," *Phys Rev Lett.* 76:1276-1279(1996).

Colburn, et al. "Step and flash imprint lithography: a new approach to high-resolution patterning," *Proc SPIE* 3676(1):379-90(1999).

Crommie, et al. "Quantum Corrals" *Physica D* 83(1-3)98-108 (1995).

Cross, et al., "Influence of elastic strains on the mask ratio in glassy polymer nanoimprint," *Appl. Phys. Lett.* 86:081902 (2005).

Eigler, et al. "Positioning single atoms with a scanning tunnelling microscope," *Nature* 344, 524-526 (1990).

Fishlock, et al. "Manipulation of atoms across a surface at room temperature" *Nature* 404(6779):743-745 (2000).

Graham, et al. "Room Temperature Mechanical Thinning and Imprinting of Solid Films" *Nano Letters* 7(2):357-362(2007).

Hoffman, et al. "Direct measurement of interatomic force gradients using an ultra-low amplitude AFM," *Proc. R. Soc. London,* A457:1161 (2007).

Hoffman, et al. "Energy Dissipation in Atomic Force Microscopy and Atomic Loss Processes," *Phys. Rev. Lett.* 87:265502-6 (2001).

Hong and Lee, "Pattern uniformity control in room-temperature imprint lithography," *Applied Physics Letters* 83(12): 2441-2443(2003).

Oral, et al. "Quantitative atom-resolved force gradient imaging using noncontact atomic force microscopy," *Applied Physics Letters* 2001—vol. 79(12):1915-1917.

Ozer, "Low-amplitude, force gradient imaging of Cu(100) surface using tunnel current feedback," *Nanotechnology* 15:1-4, S5-S8(2004).

Pethica, "Hardness measurement at penetration depths as small as 20 nm," *Philosophical Magazine A*, 48(4): 593-606 (1983).

Pethica, et al. "Tip Surface Interactions in STM and AFM" *Phys. Scr.* T19A 61-66 (1987).

Vettiger, "The Nanodrive Project: Inventing a nanotechnology device for mass production and consumer use is trickier than it sounds," *Scientific American* Jan. 2003.

Wang, et al. "Arrangement of rotational domains of the (root31'root31)R±9 degree reconstruction of Al2O3(0001) revealed by non-contact AFM," *Surface Science* 515:337-343(2002).

* cited by examiner

FIG. 8C

CYCLIC LOADING SYSTEM AND METHODS FOR FORMING NANOSTRUCTURES

CROSS REFERENCE TO RELATED APPLICATION

This application claims benefit of and priority to U.S. Provisional Patent Application No. 60/862,325 filed Oct. 20, 2006, and where permissible is incorporated by reference herein in its entirety.

FIELD OF THE INVENTION

Aspects of the disclosure are generally directed to nanofabrication and/or microfabrication systems and methods, and more particularly to systems and methods for forming micro- or nanostructures by direct mechanical contact methods.

BACKGROUND OF THE INVENTION

Forming operations are traditionally divided into machining (mass removal, milling, lathing, drilling, and chip production, waste) and deformation (mass conserving, forging, pressing, and rolling at low temperature, and molding at high temperature). For nanometer scaling forming, options have been comparatively limited. Generally, these must be mass preserving and involve unusual geometries. The increased role of surfaces and constitutive behavior may also be altered.

The replication of high resolution shapes patterned into a master silicon or quartz stamp on a target polymer film surface by direct mechanical contact is a new and promising low cost nanofabrication and microfabrication technique. Known generally as "nanoimprint", the technique has been demonstrated in applications such as semiconductor lithography, nanoelectronics, microelectronics, polymer electronics, microfluidics (lab-on-a-chip), and biological materials patterning.

Nanoprint techniques typically involve either a liquid molding process or specialized precursor materials that are subject to radiation based crosslinking to realize a permanent solid structure, or hot embossing of thermally softened films which are then quenched to solid state before demolding occurs. Limited work has been performed on purely mechanical imprinting in which shear stresses generated under normal load are sufficient to induce plastic flow.

Forming materials by direct mechanical means can be divided between machining or material removal processes and deformation which involves mass preserving forging and molding processes. Direct mechanical techniques can be used on a larger variety of substances, but these techniques are subject to a number of fidelity limiting issues including ultra-high extrusion aspect ratios, strain hardening, and elastic relaxations of the bounding surfaces due to the large pressures involved. Nanoindentation is a type of contact mechanics where the response to applied force is divided into elastic and plastic permanent indent produced). One must know tip shape to convert force and displacement to materails parameters. It is also difficult to use at 2-3 nm, although it works well at greater than 4 to 5 nm. Nano-imprint lithography or contract printing has a number of advantages, including reduced cost, simple rapid process, wide choice of materials, and high resolution. However, there are still issues with stability and fidelity of form patters, de-molding and variation of temperature, and multi-layer or multi-step processing.

Thus, there is a need for improved systems and methods for producing micro- and/or nanostructures using direct mechanical techniques.

It is therefore an object of the present invention to provide systems and methods for producing micro- and/or nanostructures using direct mechanical techniques that overcome problems such as extrusion aspect ratios far from unity, that exhibit strain hardening, and that suffer elastic relaxation of the bounding surfaces.

SUMMARY OF THE INVENTION

Systems and methods are provided for the production of microstructures, nanostructures, or a combination thereof using direct mechanical contact for producing a pattern or structure in a target material. The system includes a patterned stamp, the target material in the form of a thin layer, a substrate material, a cyclic loading actuator, and a rigid base. A vertical load cell provides a static normal load to the stamp to keep the stamp and target material in proximal contact. The stamp is moved into position and a slight normal load is placed on the system by the vertical load cell, leading to fall contact of all positive (protruding) regions of the stamp. The cyclic loading actuator, consisting of a piezoelectric element, electromagnetic voice-coil actuator, or other vibrational force generating mechanism, is then activated with sufficient amplitude such that extrusion of target material ensues. The process is continued, with possible dynamic adjustments to the amplitude of cyclic loading, until the desired level of extrusion is obtained. The stamp is then removed, revealing the patterned target film.

The method produces a pattern or structure in a target material by contacting a stamp including one or more features with a target material using a normal load sufficient for keeping the one or more features in contact with the target material, and providing a cyclic shear force in an amount sufficient to extrude the target material and form a negative relief of the one more features in the target material.

The systems and methods can be used to produce a variety of articles including, but not limited to, semiconductor integrated electrical circuits, integrated optical, magnetic, mechanical circuits and microdevices.

DETAILED DESCRIPTION OF THE INVENTION

I. Definitions

The term "aspect ratio" refers to the ratio of an object's longer dimension relative to its shorter dimension.

The term "cyclic loading actuator" refers to a device that periodically induces load.

The term "cyclic shear loading" refers to the periodic application of shear forces to promote deformation of a target material.

The term "normal load" refers to the application of static load to the stamp and/or target material such that a contact force is established between them. This will usually be in a direction perpendicular to the plane of the target material but not necessarily so. The nature and direction of this load should be such that these two bodies do not move with respect to each other after coming into full contact except when cyclic shear loading is applied.

The term "microstructure" refers to a structure having at least one dimension in the range of about 1 μm to about 1,000 μm.

The term "nanostructure" refers to a structure having at least one dimension less than 1 μm.

II. Systems for Producing Micro- or Nanostructures

The basic system includes a mount configured to receive the target material and one or more cyclic loading actuators coupled to the mount. The system also includes a stamp with one or more features to form the pattern or structure. The stamp is operatively connected to a means for providing a vertical or normal load, and is positioned relative to the target material so that the one or more features contact the target material in response to the vertical or normal load. The one or more cyclic loading actuators provide periodic shear force sufficient to extrude the target material and form the pattern or structure in the target material.

Figures 1A, 1B:
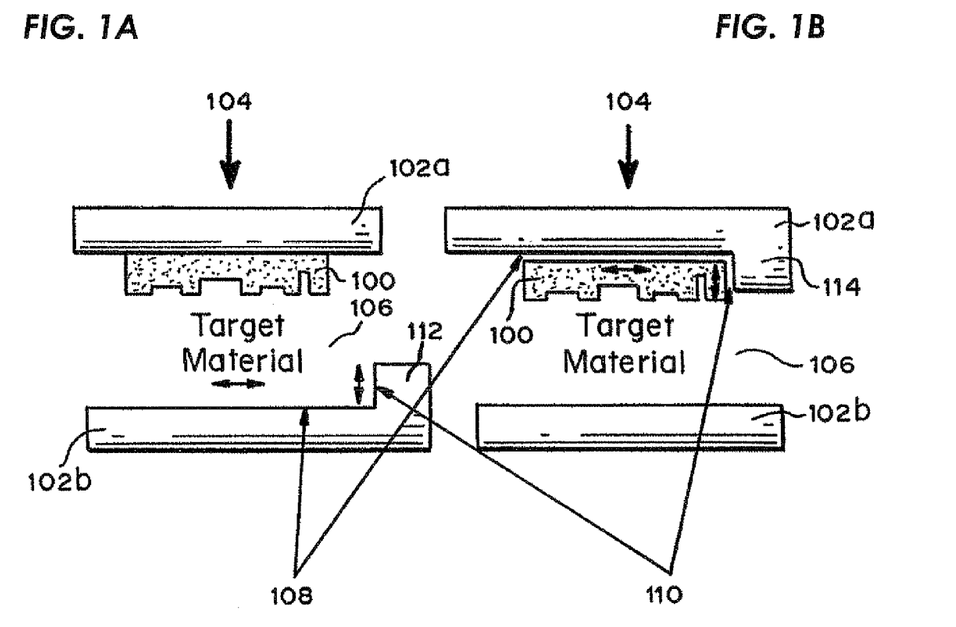
FIGS. 1A and 1B show a representative embodiment of an imprinting system, under normal loading, with a lateral cyclic loading actuator (FIG. 1A) and normal cyclic loading actuator (FIG. 1B).

FIGS. 1A and 1B show representative embodiments of a system for replicating shapes or patterns of a stamp or die into a target material, for example a polymer film surface. The shapes or patterns can produce micro- or nanostructures or combinations thereof using a method of cold and/or warm forging of ductile solids. It is believed that the systems and methods overcome or minimize the problems of nanoscopic mechanical forming of ductile solids such as extrusion aspect ratios far from unity, parasitic elastic strains, and plastic strain hardening while retaining nanometer scale feature resolutions over a wide area, avoiding adhesion and dimensional change issues associated with thermally assisted methods. The systems and methods are not limited to thermoplastic or photopolymer materials. In certain embodiments, the systems and methods activate mass transport in very high aspect ratio channels. This allows patterns of mixed transverse dimension to be formed simultaneously with good extrusion even under wide positive regions of stamps.

FIGS. 1A and 1B are cross-sectional schematics of the system for production of micro- or nano-structures onto a target material. The system consists of rigid mounts 102a, 102b, master mold or stamp 100, target material 106, under normal loading 104. FIG. 1A shows the system with a lateral cyclic loading; FIG. 1B shows the system with a normal cyclic loading actuator.

A. Mold or Stamp

The mold or stamp is also referred to as a master and can be formed of any solid, durable material. Representative molds or stamps are made of metal, metal alloys, polymers, quartz, diamond, silicon, or ceramics. It will be appreciated that the material forming the mold should be resistant to deformation at pressures, forces, and temperatures used to form shapes or patterns in a target material, but must be workable to create the patterns that are to be imprinted onto the material to be patterned. In one embodiment, the shapes and patterns are formed in the target material under ambient conditions and temperatures. In other embodiments, the shapes or patterns are formed under temperatures above ambient but below the glass transition or melting temperature of the target material.

The mold or stamp can have one or more features, for example protrusions that project along the axis normal to the face of the mold or stamp. The protrusions can be of any geometric shape including, but not limited to, cones, pyramids, cubes, rectangular bars, cylinders, or combinations thereof. The face of the stamp or mold can also have recesses, valleys, channels, or combinations thereof formed by one or more of the protrusions. The target material assumes a fill or partial negative relief replication pattern of the stamp when the stamp is pressed into the target material. The negative relief remains after the stamp is removed from the target material. Thus, the one or more protrusions of the stamp can form recesses, channels, or conduits in the target material when the stamp is pressed into a target material. The recesses in the face of the stamp can form protrusions in the target material when the stamp is pressed into the target material. The protrusions, recesses, or a combination thereof of the stamp can form a pattern including but not limited to text, bar codes, designs, geometric configurations such as circles, squares, and grids.

The features of the mold can be formed using conventional techniques, for example electron beam lithography or reactive ion etching. The dimensions of the protrusions and recesses of the stamp can vary depending on the size of structures to be formed on or in the target material. Typically, the structures formed on the target material by the stamp are of a size from about 1 nm to about 1,000 μm in at least one dimension. Nanostructures formed in or on the target material can be about 1 nm to about 1000 nm, more typically about 10 nm to about 300 nm in the axis normal to the target material. Similarly, a channel or recess formed in the target material can have a depth of about 1 nm to about 1000 nm, more typically from about 10 nm to about 300 nm. The width of the channel can be between about 1 mm to about 500 μm. In one embodiment, the distance separating two protrusions on a stamp is less than 200 mm, less than 100 nm, or even less than 10 nm.

The features of the mold can also be made from an imprint process including use of embodiments of the present invention in a master to submaster system. A sample imprinted by a submaster stamp will possess identical relief to that of the original master.

The features on the face of the stamp can be microstructures, nanostructures, and combinations thereof. The features can form one or more patterns to be transferred to a target surface.

B. Mounts

In certain embodiments, the stamp or master is optionally coupled to an upper mount 102A or a lower mount 1023 (FIGS. 1A and 1B). The mount reduces undesired motion of the stamp or target material during imprinting. The embodiment depicted in FIG. 1A shows master 100 in contact with a substantially planar upper mount 102A. The upper and lower mounts 102A, 102B can be secured to reduce all movement in dimensions other than relative movement between the stamp and target material in a desired direction. The mounts can also be formed of any solid, durable material that is able to resist deformation at the forces need to press the stamp into the target material. In another embodiment, the mount and the stamp are formed as a single unit or structure.

Lower mount 102J is configured to receive target material 106 and is positioned opposite upper mount 102A so that master 100 contacts target material 106 in response to the vertical or normal force supplied by normal load means 104. Representative vertical force means include, but are not limited to, a vertical load cell or conventional press. Vertical force is used interchangeably with normal force. Normal force is the force applied to a stamp in the axis normal to the surface of the stamp containing one or more features.

Lower mount 102B is substantially planar or optionally includes one or more ridges or protrusions 105. Typically, ridge or protrusion 112 extends at least partially, more typically completely along the length of target material 106. A cyclic loading actuator 110 for providing cyclic force in the axis normal to the target material is coupled to ridge 112. A second cyclic loading actuator 108 is optionally connected to the planar portion of lower mount 102B and configured to provide lateral cyclic force to the target material. The system can include a lateral cyclic loading actuator, a normal cyclic loading actuator, or both. Lower mount 102J is configured to receive target material 106 so that normal cyclic loading actuator 110, lateral cyclic loading actuator 108 or both are in physical contact with target material 106. In this embodiment, the cyclic loading actuators transfer the force directly to target material 106. The cyclic loading actuators can also be electrically coupled to a power supply directly or indirectly through the other components of the system.

In FIG. 1B, upper mount 102B optionally includes a vertical ridge, protrusion or lip 114. Master stamp 100 is separated from upper mount 102A by one or more lateral loading actuators 108, cyclic loading actuators 110, or both. In this embodiment, the cyclic loading force is transferred to stamp 110.

B. Target Materials

Suitable target materials that can be used with the disclosed methods and systems for forming structures and patterns include any ductile solid material that can be deformed under imprinting conditions and retain the deformation after imprinting. Exemplary target materials include natural or synthetic polymers. Suitable synthetic polymers include, but are not limited to, thermoplastics such as acrylics, polyphenelene sulfides, polyphenelene oxides, poly-(oxymethlyene)s, polyetherether ketones, styrene acrylonitriles, acrylonitrile butadine styrenes, acetals, butyrates, polyamides, polalkylenes such as polyethylene and polypropylene, polurethanes, polyamideimides, polyarylates, polybenzimidazoles, polycarbonates, polyesters, polyetheretherketones, polyetherimides, polyimides, poly(phenylene oxide)s, poly(phenylene sulfide)s, polysulfones, polyvinyl halides such as poly(vinyl chloride), and polystyrenes. Representative polyamides include nylon 6 and nylon 6,6. Representative polyesters include poly(ethylene terephthalate) and poly(butylenes terephthalate).

Thermosetting polymers can also be a target material. Exemplary thermosetting polymers include, but are not limited to, phenol-formaldehyde resins, polyurethanes, urea-formaldehyde foams, unsaturated polyesters, epoxies, diallyl phthalates, and melamine-formaldehydes.

Thermoplastic elastomers can also be used as the target materials. Examples of thermoplastic elastomers include, but are not limited to, styrene-butadiene-styrenes (SBS), poly(alkylene-co-methacrylic acids) such as poly(ethylene-co-methacrylic acid) available from DuPont under the tradename Surlyn®, and thermoplastic polyurethanes. Thermoplastic elastomers are also sold under the tradenames Santoprene® (available from Exxon Mobil) and Krayton® (available from Shell).

Electrically conductive polymers include, but are not limited to poly(N-vinyl-carbazole), polyaniline, polypyrrole, polythiophene, poly(p-phenylene, and poly(p-phenylenevinylene as well as substitutional derivatives thereof. Other suitable polymers include poly(sulfur nitride) and polyacetylene doped with electron acceptors such as arsenic pentafluoride or halogen or electron donors such as alkali metals.

As used herein, "derivatives" include polymers having substitutions, additions of chemical groups and other modifications routinely made by those skilled in the art.

The target material can also be a ceramic. Ceramic materials include, but are not limited to, alumina, zirconia, carbides, borides, nitrides, silicides, and combinations thereof. Representative ceramics include barium titanate bismuth strontium calcium copper oxide, boron carbide, boron nitride, magnesium diboride, silicon carbide, and zinc oxide.

Suitable target materials also include biological materials such as films of conglomerate bio-macromolecules or proteins, or bone and enamel;

The target material can also be a pure metal such as gold, copper, platinum, silver, lead, tin, selenium, aluminum, tungsten, molybdenum, iridium, and rhodium; alloys such as steel, bronze, and solders; and nanocrystalline materials including nanocrystalline metals and nanocrystalline ceramics.

The target material can be single layered or multilayered, for example, a laminate or multilayered film. For example the target material can include a substrate with one or more polymers or thin film overlays. The pattern or structure can be formed into the polymer overlay without damaging the substrate.

C. Cyclic Loading Actuator

Cyclic loading actuators provide periodic shear force to the stamp or the target material to increase extrusion of the target material during imprinting. Exemplary cyclic loading actuators include, but are not limited to, piezoelectric force transducers, voice-coil actuators, and other vibrational force generating means. The cyclic loading actuators produce periodic forces in the axes normal (y-axis) or horizontal (x-axis and/or z-axis) of the target material.

1. Piezoelectric Force Transducers

Piezoelectric force transducers are known in the art, for example as disclosed in U.S. Pat. No. 4,701,660. Piezoelectric force transducers can include a single sheet of piezoceramic. When an electric field having the same polarity and orientation as the original polarization field is placed across the piezoceramic, the piece expands in the thickness or "longitudinal" direction (i.e., along the axis of polarization). At the same time, the sheet contracts in the "transverse" direction (i.e. perpendicular to the axis of polarization). When the field is reversed, the motions are reversed.

The motion of a sheet of piezoceramic in the thickness direction is extremely small (on the order of tens of nanometers). However, since the length dimension is often substantially greater than the thickness dimension, the transverse motion is generally larger (on the order of microns to tens of microns). The transverse motion of a sheet laminated to or in contact with the surface of a structure such as a target material can induce the target material to stretch or bend.

2. Voice-Coil Actuators

Voice coil actuators use a magnetic field and a coil to produce a force proportional to the current applied to the coil. Voice coil actuators are usually divided into two motion types, a linear voice actuator and a rotary voice actuator. A linear voice coil actuator provides precision linear motion over short distances. Linear voice actuators are categorized by diameter, amount of force produced over stroke, and cycle time. Rotary voice actuators also carry performance specifications.

3. Vibrational Force Generating Means

Other vibrational force generating means include, but are not limited to, servo motors or linear motors. A Servo is a small device that has an output shaft. This shaft can be positioned to specific angular positions by sending the servo a coded signal. As long as the coded signal exists on the input line, the servo will maintain the angular position of the shaft. As the coded signal changes, the angular position of the shaft changes.

Linear motors are driven by electricity and provide direct linear motion without the potential complications associated with pneumatic and hydraulic systems, and without mechanical linkages such as ball screws or rack-and-pinion systems. The same forces of electromagnetism that produce torque in a rotary motor are used to produce direct linear force in linear motors. The result is a flat linear motor that produces linear force, as opposed to torque, because the axis of rotation no longer exists.

Either the stator or the rotor must be extended to develop a constant force over a given stroke. The length of the extension is determined by the length of the stroke required for the application. All linear motors are classified as short primary or short secondary. The primary is the part of the motor with the motor windings, which receives dc voltage. Depending on the type of linear motor, the windings are wound in slots in a steel lamination stack or encapsulated in epoxy.

III. Methods for Producing Structures

The method described herein relates to the use of deformation and forming driven by full extent of applied shear stress. This includes solid, rubber and liquid forming. Injection of small amplitude (approximately 1%) cyclic orthogonal strains can drive massive forming operation at highly reduced normal loads. These preserve fidelity on a local scale and allow extrusion of high aspect ratio geometries. The methods have been demonstrated for yield-stress materials, and should be applicable to all rheological classes of materials. The residual layer thinning of up to factor four over elastic limited normal loading. The method allows surface forming at extremely light loads and should provide for multilayer forming.

An exemplary method for producing micro- and/or nanostructures is depicted in FIGS. 2A-E. Generally, a target material 200 is brought into proximal contact with the face of a patterned punch or stamp 202 so that the target material 200 assumes a full or partial, negative relief, replication of the pattern on the punch or stamp. The pattern remains once the punch or stamp 202 is withdrawn.

A. Providing a Vertical or Normal Load Force

Figure 2A:
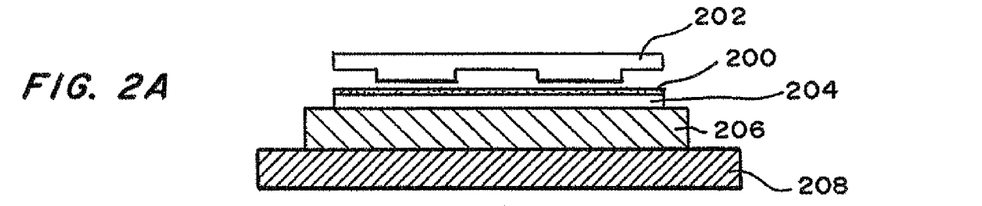
FIGS. 2A-E show a representative imprinting method.
Figure 2B:
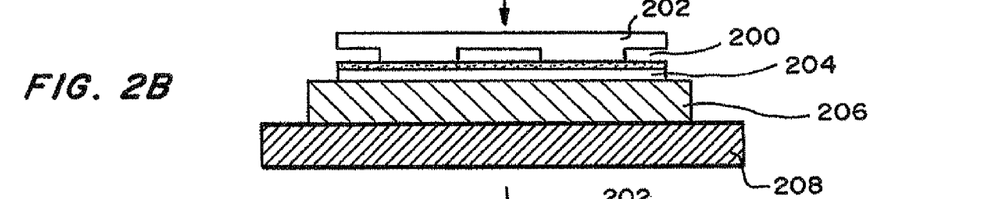

FIG. 2A shows a target material 200 overlaying a substrate 204. The substrate 204 is in contact with an actuator 206, for example a cyclic loading actuator or a horizontal shear actuator. In this embodiment, a horizontal shear actuator 206 is in turn attached to a fixed base 208. The stamp 202 is moved into position over the target material 200 and a slight normal pressure, for example about 50 MPa (megapascal) or less, is placed on the system by a vertical load cell or conventional press leading to full contact of all positive (protruding) regions of the stamp 202 (FIG. 2B).

B. Providing Cyclic Loading Force

Figure 2C:
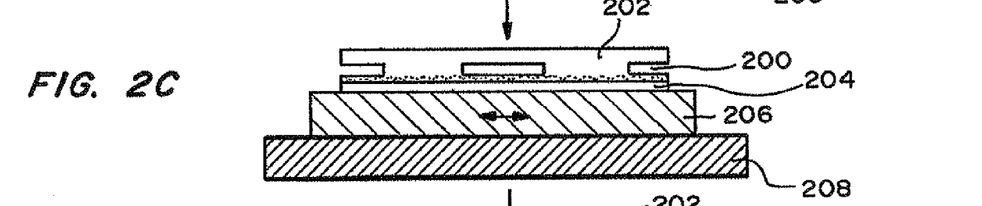
Figure 2D:
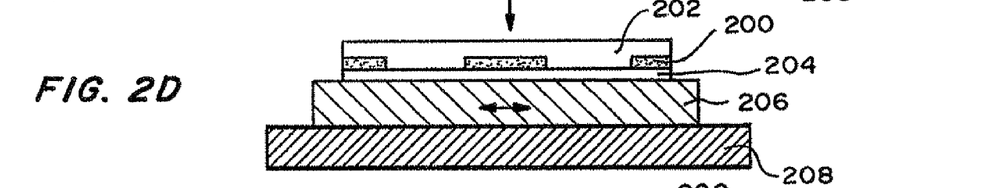
Figure 2E:
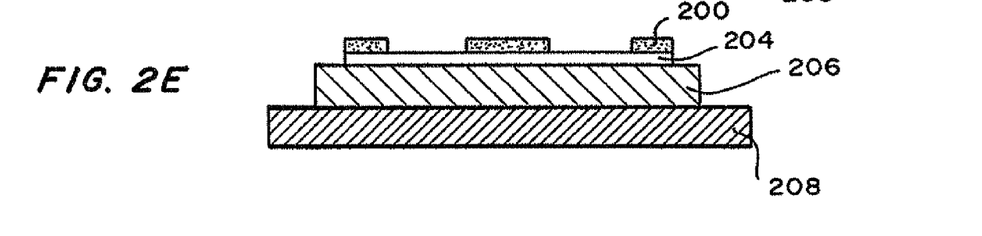

In one embodiment, the imprint, pattern, or structure is formed by the combination of a static normal loading of the stamp on the target material together with an additional cyclic loading in the normal or horizontal direction or both. Static loading refers to the extrusion obtained when a vertical or normal force is applied to bring the mold into contact with the target material. Cyclic loading refers to the extrusion of the target material caused by the application of alternating shear strains to the mold or target material. FIGS. 2C and 2D show the application of shear strains in the axis perpendicular to the normal axis of the target material 200. FIG. 2D shows the features of the stamp 202 contacting the substrate 204 as the target material 200 is extruded to fill the recesses in the stamp 202. It will be appreciated that every feature of the stamp or mold 202 need not contact the substrate 204. Cyclic loading can be achieved during the application of the vertical loading force or during specific time intervals before, during, or after application of the vertical loading force using a cyclic loading actuator. The cyclic loading actuator is activated with sufficient amplitude such that extrusion of target material ensues. Representative amplitudes include 1 to 20 nm. The process can be continued with possible dynamic adjustments to the amplitude of cyclic loading until the desired level of extrusion is obtained. The stamp is then removed, revealing the patterned target film.

It will be appreciated that the frequency or frequencies of cycling for maximum extrusion and thus optimal replication are determined by the geometry of the patterns on the master stamp, the value of the static normal load, and the nature of the stamp and target materials. Representative frequencies include 0.001 Hz to 500 KHz. The cyclic load actuators can be controlled using conventional electric or electronic controllers and processors.

Figure 3A:
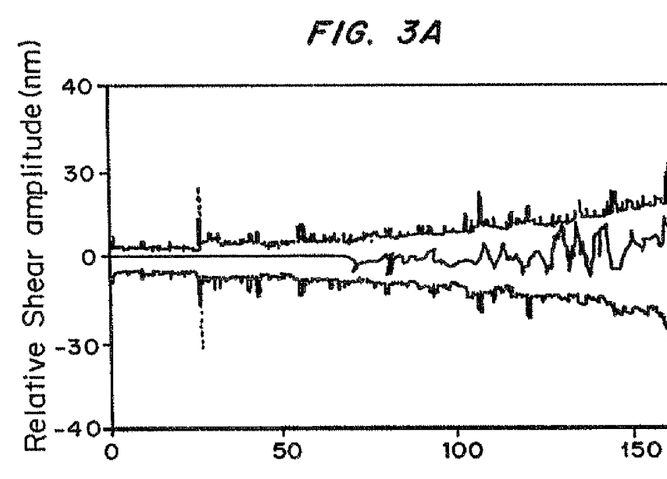
FIG. 3A shows a graph of relative shear amplitude (nm) plotted against time.
Figure 3B:
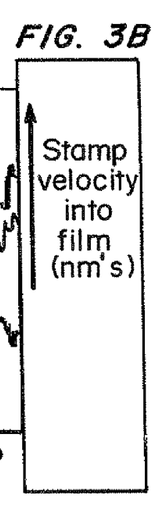
FIG. 3B is a graph of stamp velocity into the target material.

The controllers are capable of generating alternating waveforms such as sinusoidal waves, box-car waves or saw-tooth waves of sufficient amplitude (voltage) and frequency to move the actuators in the lateral direction up to a desired displacement amplitude (for example 1 to 20 nm) against the load they experience due to the lateral stiffness of the contact. FIG. 3A shows the relative shear amplitude plotted against time as the stamp is pressed into the target material. A graph of the stamp velocity into the target material is inset as FIG. 3B.

IV. Applications

The disclosed systems and methods can be applied to numerous fabrication and manufacturing techniques and to various industries, for example in fabrication of semiconductor integrated electrical circuits, integrated optical, magnetic, mechanical circuits and microdevices, and the like.

In certain embodiments, the application of direct mechanical imprinting techniques in combination with the application of lateral shear strains reduces the residual layer of target material compared to mechanical imprinting techniques without the application of lateral shear strains. Lateral shear strains refers to the strains applied in the axes lateral to the axis of the normal load. The residual layer refers to the target material that remains on the substrate after the target material overlaying the substrate is compressed by the stamp or a feature on the stamp. In certain embodiments, the residual layer is reduced by a factor of two, three, or even four fold. Extrusion aspect ratios of 30:1 or more can be achieved using shear strains of about 2% or less of the contact diameter.

A. Lithography

One embodiment provides method for forming structures in a target material using cyclic loading in combination with conventional lithography techniques. Lithography creates a pattern in a thin film carried on a substrate so that, in subsequent process steps, the pattern will be replicated in the substrate or in another material which is added onto the substrate. Since the role of the thin film is to protect a part of the substrate in the subsequent replication steps, the thin film is called a resist. A typical lithography process used for producing integrated circuits involves exposing a resist with a beam of energetic particles which are electrons, or photons, or ions, by either passing a flood beam through a mask or scanning a focused beam. The particle beam changes the chemical structure of the exposed area of the film, so that when immersed in a developer, either the exposed area or the unexposed area of the resist will be removed to recreate the patterns or its negative relief of the mask or the scanning. The lithography resolution is limited by the wavelength of the particles, the particle scattering in the resist and the substrate, and the properties of the resist.

1. Resist Patterning

The resist used in lithography can be patterned using the disclosed systems and methods. In one embodiment, a thin film of a resist, for example, polystyrene (PS), is spun onto a silicon wafer. In contrast to hot embossing lithography, the mold and the coated wafer require no heating, in particular not to a temperature above the glass transition temperature of the PS. However, heating or cooling may be applied in conjunction with the process if required for any purpose with a temperature at least up to the glass transition temperature. The features of the stamp are brought into contact with the PS using a slight normal loading pressure, for example, a pressure of about 50 MPa (megapascal) or less. Shear strains are introduced to the target material or the stamp using one or more cyclic loading actuators. The shear strain is applied until the desired motion of the stamp into the PS is achieved, Then the stamp is removed and the features of the stamp are transferred to the PS.

The areas of the resist that were compressed by protruding features of the stamp can be removed to expose the substrate. The resist can be removed using oxygen plasma or conventional chemical etching to form a conduit or recess. The patterns produced in the PS can also be replicated in a material added to the substrate. The additional material can be deposited through any desired technique over protruding features and into recesses. Suitable materials include, but are not limited to electrical conductors, semiconductors, dielectrics of the type used to fabricate integrated circuits, or ferromagnetic materials for magnetic devices. Next, a lift off process is performed in which a selective chemical etch is applied which removes the remaining PS.

2. Large Contact Pad Formation Mixed with High Resolution Circuit Printing

This application is similar to the Resist Patterning, but is provided to highlight the technique's capability of reproducing stamp patterns with exceptional variation in the lateral feature size. In this embodiment, simultaneous, monolithic forming of contact pads of dimension up to 100 micrometer with fine circuit features 100 or 1000 times smaller in lateral dimension are achieved.

B. Display Technology

1. Polymer Light Emitting Diodes

One embodiment provides a polymer light emitting diode (PLED) device. An exemplary PLED is a three layer structure having hole and electron injecting electrodes that sandwich an electronically active polymer layer, for example, about 50 nm to about 100 nm thick. The use of appropriate conjugated polymers as electrodes permits an electronically transparent and mechanically flexible display to be fabricated.

Figures 6A, 6B, 6C:
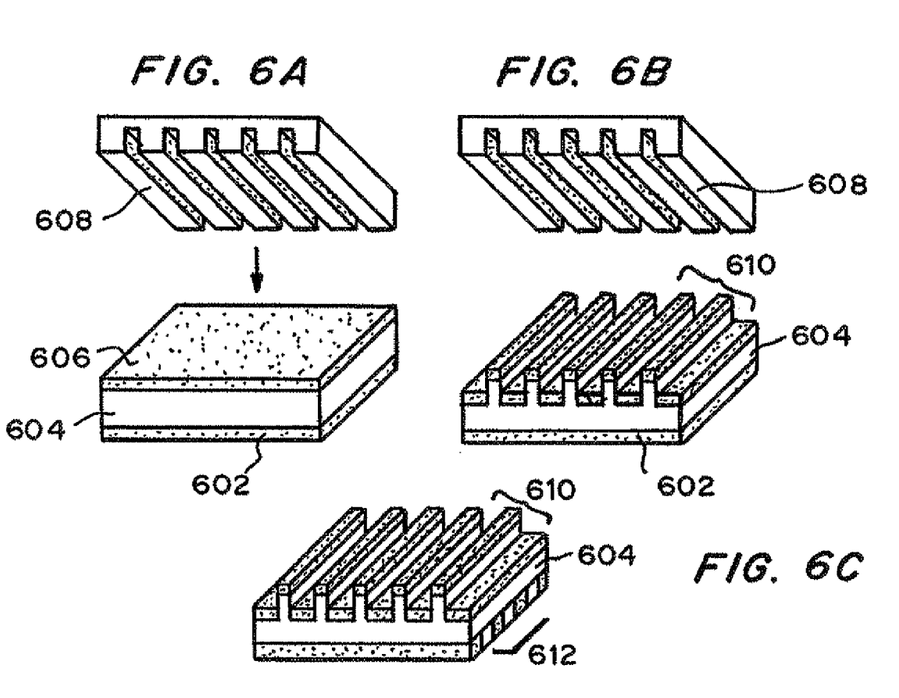
FIGS. 6A, 6B and 6C show an exemplary polymer light emitting diode device produced according to one shear forming method.

The fabrication of multilayered structures without the use of heat or long range plastic strain fields allows the patterning of material into addressed regions of lines or pixels shown in FIGS. 6A, 6B and 6C. FIG. 6A shows a base 602 covered with a light emitting diode polymer 604. The base can be any conducting solid material, for example, a metal, alloy, semiconductor wafer, ceramic or glass with conductive coating, or patterned conducting/insulating lines of the above 612, as shown in FIG. 6C. The light emitting diode polymer 604 is covered with an electrode polymer or an electronically active polymer 606. A mold or stamp 608 is then pressed into the to electrode polymer 606 and optionally into the LED polymer 604, to produce areas 610 complementary to stamp 608, as shown in FIG. 6B. Cyclic shear loading is applied to maximize extrusion. In one embodiment, cyclic shear loading is achieved by applying a vibrational force, for example by applying 10 volts peak to peak to a piezoelectric element at a frequency of 1640 Hz.

Representative light emitting diode polymers are commercially available and include, but are not limited to polyphenylene vinylenes, poly(9,9-di-octyl)fluorine, poly(9,9-dioctylfluorenyl-2,7-diyl) end capped with dimethylphenyl also called PFO, poly[2-(6-cyano-6-methyl-heptyloxy)-1,4-phenylene], and poly[(9,9-dihexylfluorenyl-2,7-diyl)-co-(2,5-p-xylene)].

2. TFT Array Patterning

The systems and methods can be used to produce organic thin-film transistors (TFT), technology upon which active matrix liquid crystal displays (LCDs) may be based. The foundation of the TFT is a semiconductor layer (typically based on a semiconducting polymer) which can switch current flow on or off by the application of an electric field. A TFT array typically includes a glass substrate having thin film transistors used to switch the sub-pixels on or off. Patterning of the TFT can accomplished using direct mechanical imprinting coupled with cyclic shear loading as described above.

TFT array patterning is a specific application of a general capability to pattern electrically active organic material such as conducting polymers (listed in target materials previously).

C. Fluidic Network Technology

Another embodiment provides a method for producing a microfluidic device, including lab-on-a-chip applications A microfluidic device is a device having one or more channels with at least one dimension less than 1 mm. The channels are formed in a target material using a stamp or mold having one or more protruding features corresponding to the desired pattern of channels. A vertical or normal load is applied to the stamp to bring the one or more features in contact with the target material. Cyclic shear force is applied during the application of the vertical or normal load using a cyclic load actuator. The application of the cyclic shear force increases the extrusion of the target material. When the stamp is removed, the resulting depressions formed by the protruding features form the channels of the device. A separate cover layer that overlies the imprinted layer can be combined with the imprinted layer to produce a device useful for processing (e.g., analyzing) samples.

Microfluidic samples include fluids such as whole blood samples, bacterial cell suspensions, protein or antibody solutions and various buffers. The devices can be used to obtain a variety of measurements including molecular diffusion coefficients, fluid viscosity, pH, chemical binding coefficients and enzyme reaction kinetics. Other applications for microfluidic devices include capillary electrophoresis, isoelectric focusing, immunoassays, flow cytometry, sample injection of proteins for analysis via mass spectrometry, PCR amplification, DNA analysis, cell manipulation, cell separation, cell patterning and chemical gradient formation. Many of these applications are useful in clinical diagnostics.

D. Optical Waveguide Systems

In this embodiment, the disclosed system and methods are applied to form curved channels in a thin film on a surface suitable for the guiding of light by total internal reflection similar to a fiber optic cable. Optical waveguides are produced by interfaces between materials with differing indices of refraction. Forming materials include optically transparent polymers and semiconductor materials such as silicon oxynitride. Possible devices include micro-ring resonators, filters, optical switches, optical multiplexers, and optical fan-outs.

E. Diffractive Optics

Another embodiment provides diffractive optic devices produced using the disclosed mechanical imprinting process coupled in combination with the application of cyclic shear force. Diffractive optics are patterned planar structures of with wide area, sub-wavelength modulation of refractive index. Diffractive optic devices include fresnel lenses, reflective grating filters, and polarizing elements fabricated in polymers and metal coated polymers. These may be designed for use with electromagnetic radiation of wavelengths ranging from infrared (10's of micrometer), to optical, ultraviolet or soft X-ray (10's of nanometer.)

Still another embodiment provides optical band-gap materials produced using the disclosed mechanical imprinting methods. Optical band-gap materials are surface or volume crystal structures of alternating dielectric constant which confine and manipulate electromagnetic radiation such as light. The regular spatial variation of dielectric constant is achieved by patterning dielectric materials such as polymers or metals with dimensions less than half the wavelength of the electromagnetic radiation employed. This includes infra-red, optical, ultraviolet, and soft X-ray radiation.

F. Biomaterial Patterning

The disclosed systems and methods can also be used to pattern biomaterial. Biomaterial can be denatured when exposed to heat. Mechanical imprinting coupled with cyclic loading at room temperature can avoid denaturing the biomaterial. Suitable biomaterial that can be imprinted using the described systems and methods include bone and enamel. The imprinted pattern can be designed, for example, to provide a scaffolding network for osteoblasts and osteoclasts to deposit additional bone. Additionally, the pattern can encode information, for example the pattern can be a bar code, text, graphic, or numbers.

In another embodiment, stamps or molds having one or more features as discussed above can also be used to pattern bio-macromolecule conglomerates or proteins into separated regions on a surface for batch assay testing. Alternatively, bio-macromolecules can be patterned into specific geometries for sensor technologies, actuators, or tissue engineering applications.

G. Nanoporous Polymer Networks

Another embodiment provides a method for manufacturing percolating nanoporous networks using the disclosed systems and methods. Potential applications of nanoporous polymer networks (NPNs) include polyelectrolytes in fuel cells, separation membranes, and substrates for nanocomposites. Designing NPNs for these applications involves controlling the network and pore structures and the resulting properties by tailoring the pore size, structure and pore interface activity/functionality. Conventional NPNs are often synthesized via free radical mechanisms and by using solvents that phase separate during polymerization.

Nanoporous polymer networks can be produced by direct mechanical imprinting of a polymer coupled with cyclic loading as discussed above. A stamp have a plurality of protruding cylindrical features wherein each feature has substantially the same diameter, can be used as a punch to create pores in a target material. The pores will have the diameter, or substantially the diameter, of the protruding features. A normal load can be applied to the punch to bring the protruding features into contact with the target material. Cyclic shear force can also be applied to increase the extrusion of the target material and create pores in the target material. The pores will typically have a diameter of less than about 100 nm, less than about 50 nm, or less than about 25 nm. It will be appreciated that the pores can have the same or different diameters.

H. Chemical Lithography

Another embodiment provides methods and systems for the direct patterning of ductile metallic films such as platinum or other catalytic elements that allow or promote spatially selected chemical reactions and nucleation sites. For example, a catalytic element can be imprinted with features that act as nucleation sites or catalytic sites for the growth of metallic or semiconductor whiskers or nanowire forests.

I. Microscopy Aids

The disclosed methods and systems can be used for microscope tip characterization. For example, scanned probe microscopes including scanning tunneling microscopes, atomic force microscopes, magnetic force microscopes, and their derivatives require calibration grids of well defined patterns to characterize the shape of the scanning tip used. These grids and patterns can be produced using the methods and systems described above. In addition, the tip scanning element of the microscopy (piezoelectric crystal usually, or voice coil) may be calibrated in three dimensions by forming images of precisely and accurately defined patterns fabricated by the technique and methods.

J. Surface labeling

Smooth surfaces of bulk materials (i.e., not a thin film) may be patterned with letters, numbers, bar codes, images or other symbols using the technique for the purposes of labeling. Such labeling may used for logistical tracking, sorting, processing or security purposes with suitable detectors to scan, read and identify the patterns on the surfaces. The microscopic to nanoscopic scale of this labeling avoids interfering with the primary function of the device associated with the labeled surface(s). In addition, if the labeling is repeated over wide areas of a surface of an object, the breaking up of the constitutive parts of the object either by accidental fracture or breakage or by deliberate action will allow the identification of the original pieces that one formed the single labeled surface.

Those skilled in the art will recognize, or be able to ascertain using no more than routine experimentation, many equivalents to the specific embodiments of the invention described herein. Such equivalents are intended to be encompassed by the following claims.

EXAMPLE

Example 1

Shear Based Residual Layer Thinning

Figures 4A, 4B:
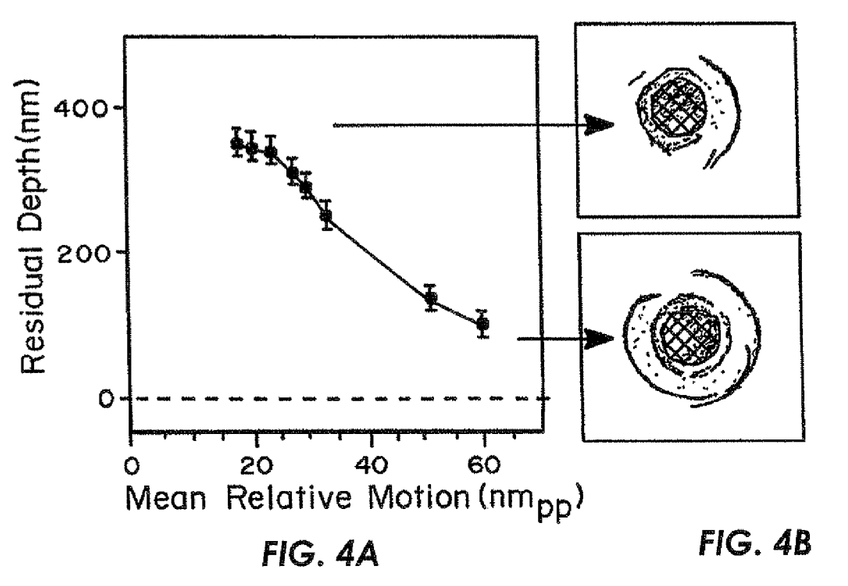
FIG. 4A shows a graph of residual layer depth (nm) plotted against mean relative motion ($nm_{pp}$).
FIG. 4B are micrographs showing the difference in residual material at different relative motion levels.

FIGS. 4A and 4B demonstrate shear based residual layer thinning, with an extrusion aspect ration up to 30:1 or more, all at very small lateral shear strains of at most 2%. In this example, a 3 micrometer diameter punch made of silicon thinned an initially 950 nm thick layer of polystyrene from a residual depth (ie. remaining thickness of the film) of 380 nm down to 90 nm according to the amount of oscillating shear force applied. FIG. 4A shows the relative depth of the residual layer (nm) verses the mean relative motion ($nm_{pp}$). FIG. 4B are atomic force micrographs showing the surface of residual layers and surrounding extruded material that remain after stamp removal for no shear based forming (top) and the maximum (to 90 nm residual thickness) shear based forming. The fine, cross-hatched lines are 60 nm wide replicas of fine, 60 nm wide lines formed on the face of the flat punch used. It can be seen that these fine lines are preserved for the maximum shear extrusion to the 90 nm residual layer thickness.

Example 2

Residual Film Thickness as a Function of Applied Mean Normal Pressures

Figure 5:
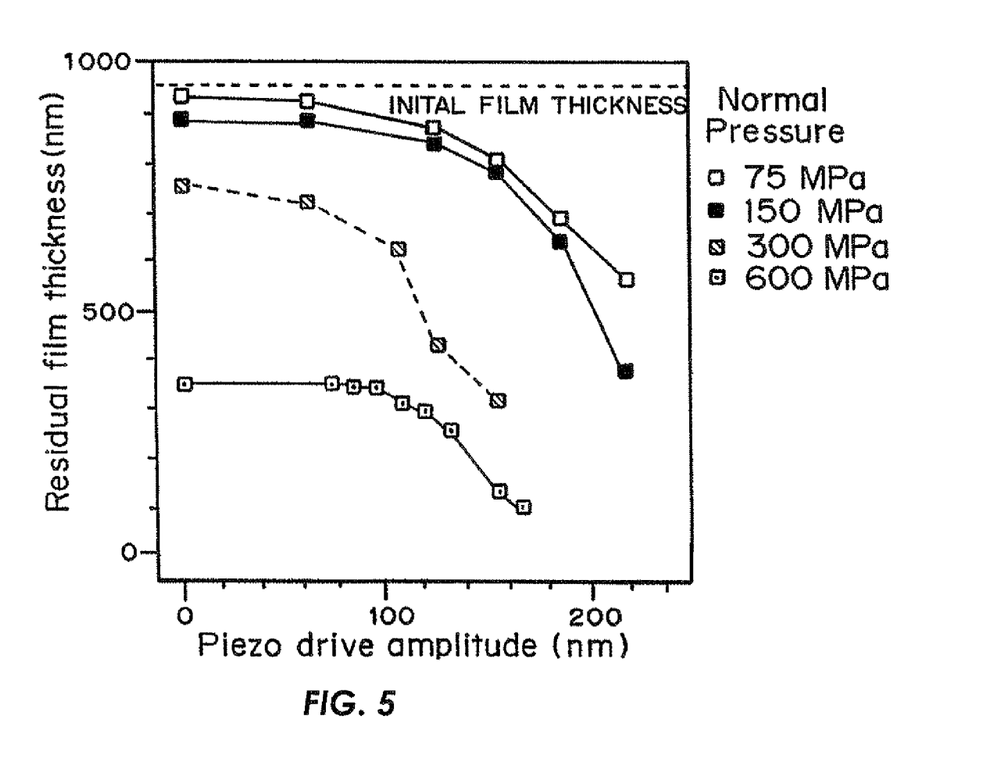
FIG. 5 shows a graph of residual film thickness plotted against piezo drive amplitude at varying amounts of normal load.

FIG. 5 is a graph of residual film thickness (nm) plotted against piezo drive amplitude (nm), at four different applied mean normal pressures: 75 MPa, 150 MPa, 300 MPa, and 600 MPa. A silicon flat punch of diameter 3 micrometer is used to thin a 950 nm thick film of polystyrene. The graph demonstrates film thinning as a function of applied piezo drive amplitude for each mean normal pressure. As piezo drive amplitude increases, the residual film thickness decreases. The actual stamp-polymer relative motion is about 20% of the drive amplitude, and at most about 1% the width of the stamp.

Example 3

Cyclic Shear Loading Improves Extrusion

Figure 7:
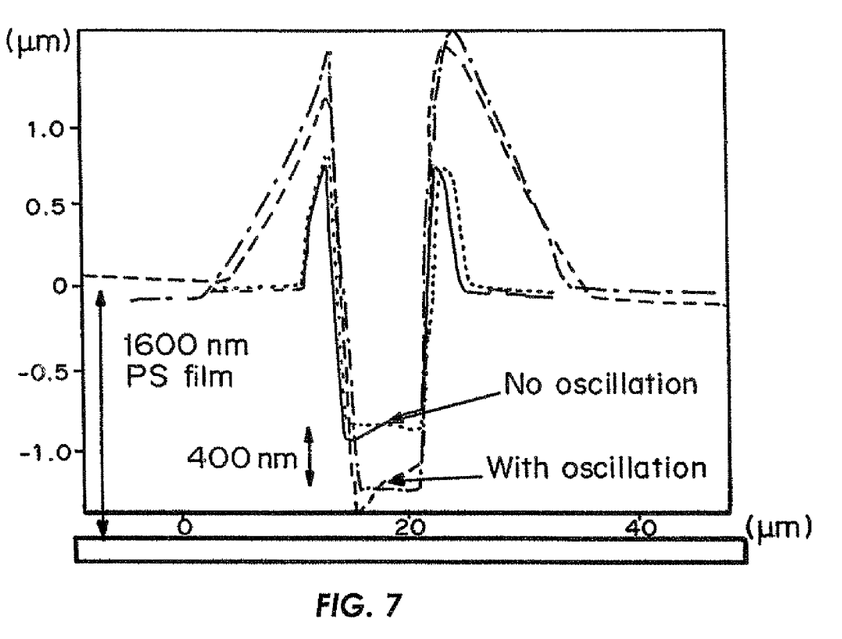
FIG. 7 shows a graph of imprinted target material showing enhanced extrusion of the target material (400 nm) in a 1600 nm polystyrene film.

A flat punch indented into a 1600 nm polystyrene film to a mean pressure of 550 MPa without oscillation leaves a profile, as shown in FIG. 7. Under the same conditions, but with additional application of lateral sinusoidal loading by applying 10 volts peak-to-peak to a piezoelectric element at a frequency of 1640 Hz (with oscillation), the sheared contact is seen to have an additional 400 nm of extrusion (FIG. 7). The 400 nm increase in extrusion converts to mask ratio improvement from 1600:600=8:3 to 1600:200=8:1, for a significant three fold improvement. The extrusion occurs in a brief instant for example less than 0.1 second upon the application of the oscillating force.

Example 4

Demonstration of Cyclic Shear Loading

Figure 8A:
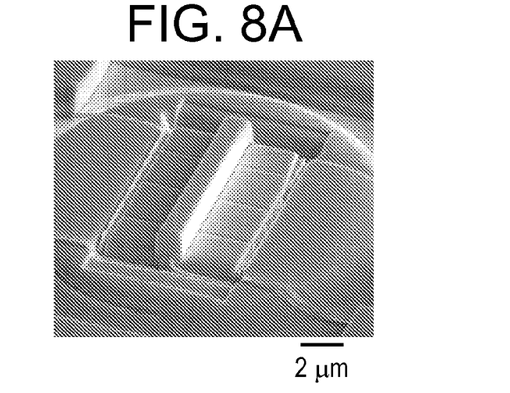
FIGS. 8A-C show electron micrographs of a stamp of a single bar (5A); indication of cross-sectioned segments of a stamp of a single bar (5B); and successive cross-sections of a stamped material at 0, 10, and 20 nm amplitude cyclic motion of the stamp at 500 Hz under 0.5 mN load. The stamp shows increased extrusion with increased cyclic motion.
Figure 8B:
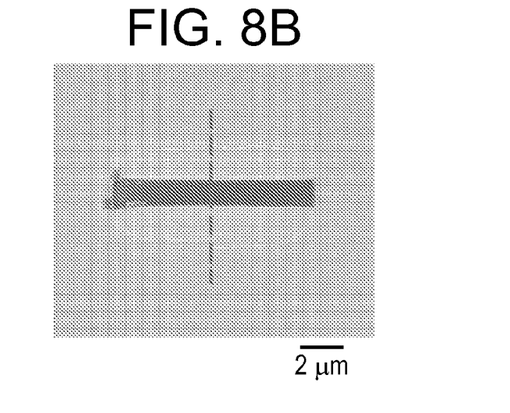
Figure 8C:
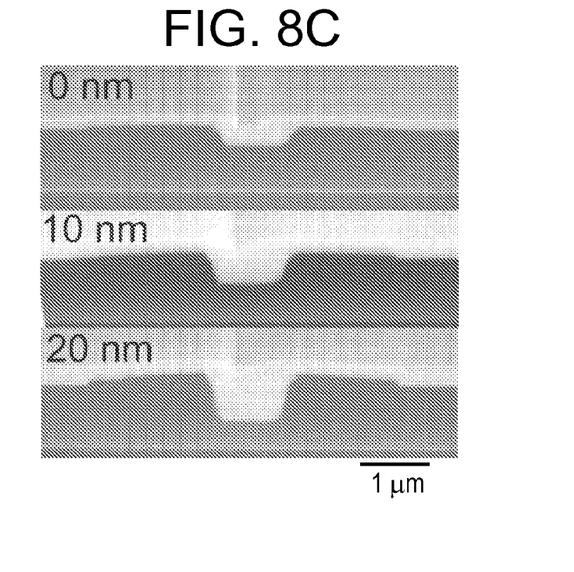

A physical demonstration of the effect of cyclic shear loading is shown in FIGS. 8A, B and C. The stamp of a single bar of dimension 1×1×10 micrometers is shown in FIG. 8A. The effect of small amplitude (0, 10, 20 nm) cyclic motion of the stamp at 500 Hz under 0.5 mN normal load is shown in electron micrographs of cross-sections of the imprints. FIG. 8B shows how the sections were taken. FIG. 8C shows the progressively increased extrusion with increased cyclic motion, despite the extremely small amplitudes of employed motion.

Modifications and variations will be obvious to those skilled in the art from the foregoing detailed description and are intended to come within the scope of the appended claims.

We claim:

1. A system for producing a pattern or structure in a target material comprising
    a mount configured to receive the target material;
    one or more cyclic loading actuators coupled to the mount, wherein the one or more cyclic loading actuators provide periodic shear force sufficient to increase extrusion of the target material;
    a stamp with one or more features to imprint the pattern or structure operatively connected to a means for providing a vertical load, wherein the stamp is positioned relative to the target material so that the one or more features contact the target material in response to the vertical load,
    wherein the system applies the cyclic shear force to the stamp, material or mount during the application of the vertical load.

2. The system of claim 1 comprising
    an upper mount operably connected to a load cell or conventional press for producing a vertical or normal load;
    a stamp comprising one or more features to imprint the pattern or structure in the target material, wherein the stamp is operably connected to the upper mount;
    one or more cyclic loading actuators coupled to the upper mount, wherein the one or more cyclic loading actuators provide periodic shear force sufficient to form the pattern or structure in the target material; and
    a lower mount configured to receive the target material wherein the lower mount is positioned relative to the stamp so that the one or more features of the stamp contact the target material in response to the vertical or normal load.

3. The system of claim 1, wherein the one or more cyclic loading actuators are selected from the group consisting of a piezoelectric force transducer, servo motor, and a linear motor.

4. The system of claim 1, wherein the one or more cyclic loading actuators provide periodic shear force in an axis normal to the target material.

5. The system of claim 1, wherein the one or more cyclic loading actuators provide periodic shear force in an axis perpendicular to the axis normal to the target material.

6. The system of claim 1, wherein the one or more features of the stamp produce a negative relief in the target material.

7. The system of claim 1, wherein the target material is a polymer.

8. The system of claim 1, wherein the pattern or structure produced in the target material are microstructures, nanostructures, or a combination thereof.

* * * * *

UNITED STATES PATENT AND TRADEMARK OFFICE
CERTIFICATE OF CORRECTION

PATENT NO. : 7,632,088 B2
APPLICATION NO. : 11/875303
DATED : October 19, 2007
INVENTOR(S) : John B. Pethica et al.

It is certified that error appears in the above-identified patent and that said Letters Patent is hereby corrected as shown below:

Claim 1, column 14, line 22, replace "the cyclic shear force" with --the periodic shear force--.
    Claim 3, column 14, line 42, replace "servo motor" with --a servo motor--.

Signed and Sealed this

Twenty-fifth Day of May, 2010

David J. Kappos
*Director of the United States Patent and Trademark Office*